United States Patent
Clauss

(10) Patent No.: US 7,679,721 B2
(45) Date of Patent: Mar. 16, 2010

(54) PROJECTION OBJECTIVE OF A MICROLITHOGRAPHIC PROJECTION EXPOSURE APPARATUS AND METHOD FOR ITS PRODUCTION

(75) Inventor: Wilfried Clauss, Tuebingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 425 days.

(21) Appl. No.: 11/401,789

(22) Filed: Apr. 3, 2006

(65) Prior Publication Data

US 2006/0238895 A1    Oct. 26, 2006

Related U.S. Application Data

(60) Provisional application No. 60/672,776, filed on Apr. 19, 2005.

(51) Int. Cl.
    *G03B 27/54*    (2006.01)
    *G03B 27/42*    (2006.01)
(52) U.S. Cl. .......................................... 355/67; 355/53
(58) Field of Classification Search .................. 355/67, 355/53; 359/649
    See application file for complete search history.

(56) References Cited

U.S. PATENT DOCUMENTS

| 2002/0149855 A1 | 10/2002 | Schuster et al. |
| 2003/0137733 A1 | 7/2003 | Gerhard et al. |
| 2003/0174408 A1 | 9/2003 | Rostalski et al. |
| 2003/0234981 A1 | 12/2003 | Hoffman et al. |
| 2004/0065117 A1 | 4/2004 | Chen et al. |
| 2004/0105170 A1 | 6/2004 | Krahmer et al. |
| 2006/0012885 A1* | 1/2006 | Beder et al. ................. 359/649 |
| 2006/0050400 A1 | 3/2006 | Hoffman et al. |
| 2006/0130692 A1* | 6/2006 | Peterman et al. ............. 101/485 |
| 2006/0198029 A1* | 9/2006 | Schuster ..................... 359/649 |
| 2007/0091451 A1* | 4/2007 | Schuster ..................... 359/649 |
| 2007/0165198 A1* | 7/2007 | Kneer et al. .................. 355/18 |

FOREIGN PATENT DOCUMENTS

| WO | WO 2005/059617 | 6/2005 |
| WO | WO 2005/059618 | 6/2005 |
| WO | WO 2005/081067 | 9/2005 |

* cited by examiner

*Primary Examiner*—Georgia Y Epps
*Assistant Examiner*—Danell L Owens
(74) *Attorney, Agent, or Firm*—Fish & Richardson P.C.

(57) ABSTRACT

A projection objective of a microlithographic projection exposure apparatus has a first lens, which is the penul-timate curved optical element on the image side. The first lens has a concave surface on the image side and contains a first intrinsically birefringent crystal, which has a first orientation of the crystal axes. The projection objective furthermore has a second lens, which is the last curved optical element on the image side and has a convex surface on the object side. The second lens contains a second intrinsically birefringent crystal, which has a second orientation of the crystal axes. The latter can be described by rotating the first orientation of the crystal axes about a symmetry axis of the first lens. The first and second orientations of the crystal axes are selected so that an intrinsic birefringence due to the first crystal, together with an intrinsic bire-fringence due to the second crystal, leads in total to at least approximately axisymmetric distribution of the overall birefringence.

27 Claims, 5 Drawing Sheets

PROJECTION OBJECTIVE OF A MICROLITHOGRAPHIC PROJECTION EXPOSURE APPARATUS AND METHOD FOR ITS PRODUCTION

CROSS-REFERENCE TO RELATED APPLICATION

Under 35 U.S.C. §119(e)(1), this application claims benefit of provisional U.S. application Ser. No. 60/672,776 filed Apr. 19, 2005, the entire contents of which are hereby incorporated by reference.

BACKGROUND OF THE INVENTION

1. Field of the Invention

The invention relates to a projection objective for microlithographic projection exposure apparatus, such as those used for the production of large-scale integrated electrical circuits and other microstructured components. The invention also relates to a method for the production of such a projection objective.

2. Description of Related Art

Integrated electrical circuits and other microstructured components are conventionally produced by applying a plurality of structured layers on a suitable substrate which, for example, may be a silicon wafer. In order to structure the layers, they are first covered with a photoresist which is sensitive to light of a particular wavelength range. The wafer coated in this way is subsequently exposed in a projection exposure apparatus. A pattern of structures, which is arranged on a reticle, is thereby imaged onto the photoresist with the aid of a projection objective. Since the imaging scale is generally less than 1, such projection objectives are often also referred to as reduction objectives.

After the photoresist has been developed, the wafer is subjected to an etching or deposition process so that the top layer becomes structured according to the pattern on the reticle. The remaining photoresist is then removed from the other parts of the layer. This process is repeated until all the layers have been applied on the wafer.

One of the essential aims in the development of the projection exposure apparatus used for production is to be able to lithographically define structures with smaller and smaller dimensions on the wafer. Small structures lead to high integration densities, and this generally has a favorable effect on the performance of the microstructured components produced with the aid of such apparatus.

The size of the structures which can be defined depends primarily on the resolution of the projection objective being used. Since the resolution of the projection objectives becomes better as the wavelengths of the projection light become shorter, one way of increasing the resolution is to use projection light with shorter and shorter wavelengths. The shortest wavelengths used at present are in the deep ultraviolet (DUV) spectral range, namely 193 nm and 157 nm.

Another way of increasing the resolution is based on the idea of increasing the numerical aperture of the projection objective with the aid of an immersion liquid. To this end, the immersion liquid is introduced into the intermediate space which remains between the last lens on the image side of the projection objective and the photoresist, or another photosensitive layer to be exposed. Projection objectives which are specially designed for immersed operation, and which are therefore also referred to as immersion objectives, can achieve numerical apertures of more than 1, for example 1.3 or 1.4.

The last lens on the image side of high-aperture immersion objectives is usually curved very convexly on the object side and planar on the image side, in order to keep the possible ray angles of incidence less than 90° and therefore prevent undesired total reflection. Since this lens is generally very thick, it is usually made of fluorspar ($CaF_2$) or another cubic crystalline material, for example $BaF_2$, $LiF_2$ or mixed crystals such as $Ca_{1-x}Ba_xF_2$. In contrast to conventional lens materials, for instance synthetic quartz glass, these crystals are still sufficiently transparent even for DUV projection light.

As it has now been found, however, these crystals are intrinsically birefringent at wavelengths in the deep ultraviolet spectral range. The term optically birefringent refers to materials with an anisotropic refractive index. This means that for a light ray passing through the material, the refractive index depends on its polarization and its orientation with respect to the material. The term birefringence in the stricter sense refers to the maximum possible refractive index difference $\Delta n$ of a birefringent material. Owing to the polarization-dependent refractive indices, an unpolarized light beam is generally split into two beam components with mutually orthogonal linear polarizations when it enters a birefringent material.

If birefringence occurs in a projection objective, this will lead, unless suitable countermeasures are taken, to intolerable contrast losses in the image plane where the photosensitive layer is arranged.

In order to reduce the intrinsic birefringence in $CaF_2$ and similar cubic crystals as much as possible, it has been proposed to select the orientations of the crystal axes of a plurality of crystals in order to obtain at least approximately axisymmetric direction distributions of the birefringence, or even so that the birefringent effects of the individual optical elements substantially cancel out one another. In general, the crystal lattices are mutually rotated about one of the crystal axes.

In a lens which is made of a single birefringent crystal, it is not possible to achieve compensation or symmetrization of the birefringent properties. For this reason, US 2004/0105170 A1 proposes the designed splitting of lenses into two lens components, which are contact bonded to each other after having been rotated. A method in which the lens preform is made from individual plates contact bonded to each other, which differ from each other with respect to the orientation of the crystal axes, is described as even more favorable. The lens preform consisting of two or more individual plates is then grinded and polished as a whole in a manner which is known as such.

This concept is modified in US 2003/0137733 A1 in so far as the individual plates of which the preform is made consist of crystals with a complementary birefringent character, for example calcium fluoride on the one hand and barium fluoride on the other hand. The splitting of two plane-parallel plates which are the last optical elements on the image side of the projection objective, respectively into two individual plates with mutually rotated orientations of the crystal axes, is furthermore described.

These known approaches to resolving the problem of birefringence, however, cannot readily be applied to the last lenses on the image side of projection objectives with particularly high numerical apertures, such as those which are possible in a design for immersed operation. The reason for this is that very large angles of incidence can occur at the planar interfaces between the crystals with different orientations of the crystal axes. At least rays with large aperture angles (i.e. rays which make a very large angle with the optical axis) could then be totally reflected at this interface. The high numerical aperture, which would be possible per se, is therefore reduced again.

US 2003/0234981 A1 discloses a projection objective comprising a first lens that is the penultimate curved optical element on the image side and has a concave surface on the image side. The first lens is made of a $CaF_2$ crystal in a [110] crystal axis orientation. The projection objective furthermore has a second lens, which is the last curved optical element on the image side. It has a convex surface on the object side and is also made of a $CaF_2$ crystal in a [110] crystal axis orientation, which is rotated, in relation to the crystal axis orientation of the first lens, by 120° about a symmetry axis of the first lenses.

SUMMARY OF THE INVENTION

It is therefore an object of the invention to provide a projection objective for a microlithographic projection exposure apparatus which allows the use of intrinsically birefringent lens materials even in a design for very high numerical apertures. The intention is to make it possible to symmetrize the intrinsic birefringence, but without the possibility of light rays with large aperture angles being totally reflected.

It is also an object of the invention to provide a method for the production of such a projection objective.

The first object, relating to the projection objective, is achieved according to the invention by a projection objective of a microlithographic projection exposure apparatus for imaging a reticle that can be arranged in an object plane of the projection objective onto an image plane, which contains a first lens that is the penultimate curved optical element on the image side and has a concave surface on the image side. The first lens contains a first intrinsically birefringent crystal, which has a first orientation of the crystal axes. The projection objective furthermore has a second lens, which is the last curved optical element on the image side. It has a convex surface on the object side and contains a second intrinsically birefringent crystal. This has a second orientation of the crystal axes, which can be described by rotating the first orientation of the crystal axes about a symmetry axis of the first lens. The first and second orientations of the crystal axes are selected so that an intrinsic birefringence due to the first crystal, together with an intrinsic birefringence due to the second crystal, leads in total to at least approximately axisymmetric distribution of the overall birefringence.

According to the invention, the interface between two successive intrinsically birefringent crystals with different orientations of the crystal axes is not planar, but curved so that light rays passing through this interface cannot experience total reflection even if they emerge from the first lens at very large angles with respect to the optical axis of the projection objective.

With suitably selected orientations of the crystal axes it is possible to rotate the crystal axes so that an intrinsic birefringence due to the first crystal, together with an intrinsic birefringence due to the second crystal, leads in total to at least approximately axisymmetric distribution of the overall birefringence.

Achieving an at least approximately axisymmetric distribution of the overall birefringence is particularly advantageous if the lenses are made of crystals having a very high refractive index n>1.8. Such a high refractive index is required if the potential of immersion liquids with equally high refractive indices shall be fully exploited. However, these materials have a very large intrinsic birefringence which is about five times as large as the intrinsic birefringence of $CaF_2$. For that reason it is of particular importance to achieve an at least approximately axisymmetric distribution of the overall birefringence, because otherwise the contrast in the image plane will be substantially reduced due to birefringence caused by the first and second lens.

One of these very high refractive index materials is LUAG, however, other similar materials may be envisaged as well, for example $MgAl_2O_4$ or materials that may be described by the following formulas:

$X_3Al_5O_{12}$ with X=Lu, Sc or a mixture thereof, $X_3Y_2Z_3O_{12}$ with X=Mg, Ca;

Y=Al, Ga, Sc, Y, Lu;

Z=Ge, Si

In principle, it is possible for the first lens to touch the second lens at a point, along a line or over a surface. If they touch over a surface, then contact bonding of the two lenses may in particular be envisaged. The contact bonding of intrinsically birefringent crystals along curved surfaces is difficult, however, since this leads to somewhat undesirable material stresses which cause a stress-induced birefringence that is difficult to correct.

In a preferred exemplary embodiment, the first lens is separated from the second lens by a gap. This makes it possible to avoid the difficulties associated with contact bonding. In this case as well, however, it is necessary to manufacture the mutually opposing faces with a high precision in order to avoid imaging errors.

The manufacture of these surfaces becomes less critical when the gap between the lenses is filled with a liquid, which reduces the refractive index difference at the interface between the two lenses and therefore the refracting effect of the gap. Ideally, the liquid introduced into the gap has a refractive index which differs as little as possible from the refractive indices of the adjacent crystals, for example by no more than 5%.

The curvature of the concave surface of the first lens may in this case be selected so that no light ray passing through this surface is totally reflected. When establishing the curvature of this surface, it is generally necessary to take into account the numerical aperture of the projection objective, the refractive index of the first crystal and the refractive index of a surrounding medium.

The two lenses need not necessarily be the last optical elements of the projection objective. For example, the second lens lying closest to the image plane may possibly be followed by at least one plane-parallel plate. Such a plate should be fitted into a housing of the projection objective so that it can easily be replaced by another plate in the event of contamination or degradation.

In principle, it is possible to make each of the two lenses from a single crystal preform, whose orientations of the crystal axes are respectively selected suitably. Since the curvature of the mutually opposing faces of the lens will often be very great, however, a relatively large amount of crystal material is lost in this type of production.

This disadvantage is avoided in a production method according to the invention, which achieves the object relating to the method. The method according to the invention comprises the following steps:

a) Providing a housing of the projection objective, b) Providing a crystal which is optically birefringent for the wavelength used in the projection exposure apparatus;

c) Splitting the crystal into a first lens and a second lens along a curved bowl-shaped separating surface, which is axisymmetric with respect to a symmetry axis, so that the first lens is provided with a concave surface;

d) Mutually rotating the two lenses about the symmetry axis;

e) Fitting the first and second rotated lenses into the housing so that the first lens is the penultimate curved lens on the image side and the second lens is the last curved lens on the image side of the projection objective.

Since the two lenses are produced by splitting a single crystal along a curved bowl-shaped separating surface, it is possible to save a significant amount of material. This is important since the intrinsically birefringent crystals in question here, such as calcium fluoride or barium fluoride, are extremely expensive and available only in small quantities.

According to another aspect of the invention, a projection objective of a microlithographic projection exposure apparatus is provided for imaging a reticle that can be arranged in an object plane of the projection objective onto an image plane. The projection objective comprises a first lens that is the penultimate curved optical element on the image side, has a convex surface on the object side and a concave surface on the image side. The first lens contains a first intrinsically birefringent crystal, which has a first orientation of the crystal axes. The projection objective furthermore has a second lens, which is the last curved optical element on the image side. It has a convex surface on the object side and contains a second intrinsically birefringent crystal. This has a second orientation of the crystal axes, which can be described by rotating the first orientation of the crystal axes about a symmetry axis of the first lens.

The curvature of the convex surface on the object side of the first lens should be strong enough to keep the angels of incidence small. Preferably, therefore, the radius of curvature of the surface is below 1000 mm and even more preferably below 500 mm.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
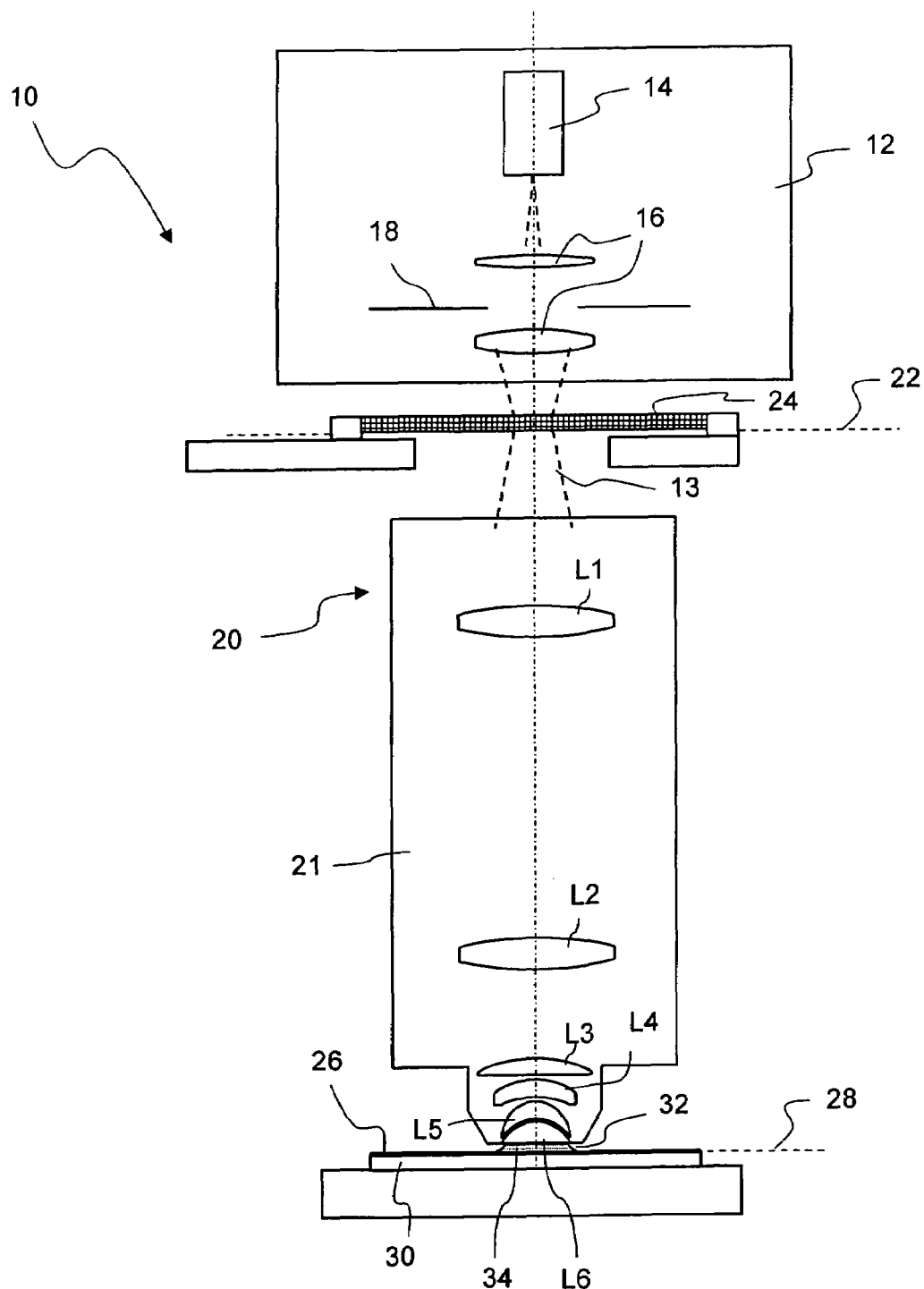
FIG. 1 shows a meridian section through a microlithographic projection exposure apparatus having a projection objective according to the invention, in a highly simplified representation which is not true to scale.

FIG. 1 shows a meridian section through a microlithographic projection exposure apparatus, denoted overall by 10, in a highly simplified representation which is not true to scale. The projection exposure apparatus 10 has an illumination device 12 for generating projection light 13, which comprises a light source 14 designed as an excimer laser, illumination optics indicated by 16 and a diaphragm 18. In the exemplary embodiment which is represented, the projection light 13 has a wavelength of 193 nm lying in the ultraviolet spectral range. It is of course also possible to use projection light with other wavelengths, for example 248 nm or 157 nm.

The projection exposure apparatus 10 furthermore includes a projection objective 20 which contains a housing 21 and a multiplicity of lenses, only some of which denoted by L1 to L6 are schematically indicated in FIG. 1 for the sake of clarity. The projection objective 20 is used to project a reduced image of a mask 24, which is arranged in an object plane 22 of the projection objective 20, onto a photosensitive layer 26. The layer 26, which may for example consist of a photoresist, is arranged in an image plane 28 of the projection objective 20 and is applied on a support 30. Specific examples of the production of the projection objective 20 can be found in US 2002/149855 A1 and US 2003/174408 A1 in the name of the Applicant, the content of which is fully incorporated into the subject-matter of the present application.

An immersion liquid 34 is introduced into an intermediate space 32, which remains between the last lens L6 on the image side and the photosensitive layer 26. A suitable immersion liquid 34 is, for example, water which may be supplemented with additives consisting of sulfates, phosphates or alkali metals such as caesium. It is also possible to use perfluoropolyethers or sulfuric acid as an immersion liquid. Other immersion liquids, which may likewise be used in the projection exposure apparatus 10, are also known in the prior art.

Figure 2:
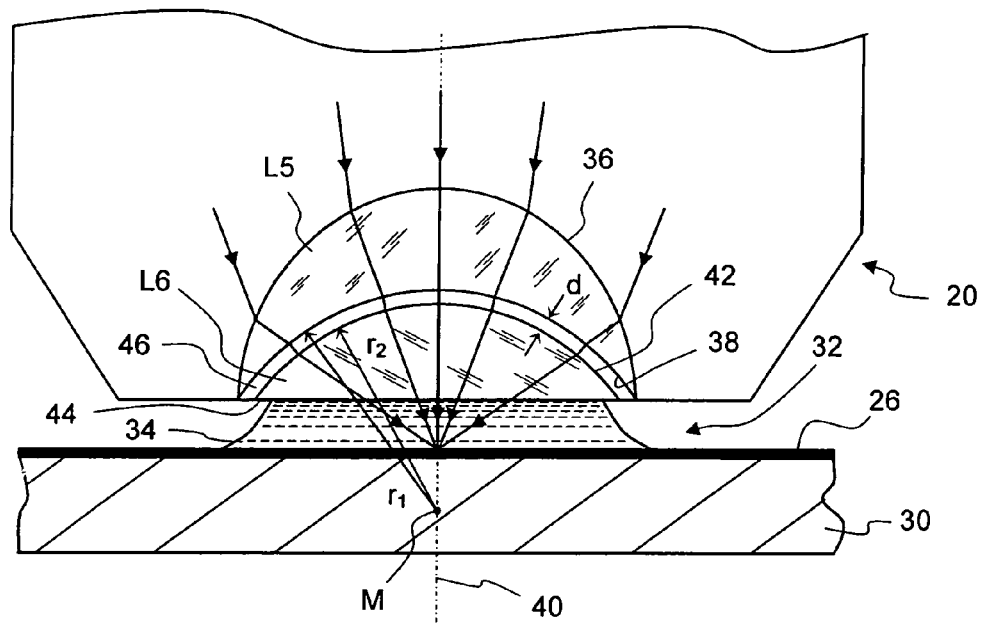
FIG. 2 shows an enlarged part of FIG. 1, in which further details can be seen in the region of the image-side end of the projection objective.

FIG. 2 shows an enlarged part of FIG. 1, in which further details can be seen in the region of the image-side end of the projection objective 20. The penultimate lens L5 on the image side is a convexoconcave lens with an overall positive refracting power. Both the convex front surface 36 and the concave rear surface 38 are highly curved.

The lens L6 has a convex front surface 42 and a planar rear surface 44, which adjoins the immersion liquid 34 directly or via a protective layer (not shown in FIG. 2) which may also be formed by a plane-parallel plate.

Only a narrow gap 46 remains between the lens L5 and the lens L6, so that the lens L6 has the appearance of a hemisphere accommodated in a spherical bowl formed by the lens L5. The rear surface 38 of the lens L5 and the front surface 42 of the lens L6 are spherically curved in this exemplary embodiment, and have the same centre of curvature M. The gap 26 therefore has the same thickness d everywhere. The thickness d measured in the radial direction is in this case given by $d=r_1-r_2$, where $r_1$, $r_2$ are the radii of curvature of the rear surface 38 and the front surface 42, respectively. The radii of curvature $r_1$, $r_2$ are selected so that light rays passing through the lens L5 cannot be totally reflected at the concave rear surface 38 of the lens L5.

In the exemplary embodiment represented, both the lens L5 and the lens L6 consist of calcium fluoride ($CaF_2$) crystals.

Figure 3A:
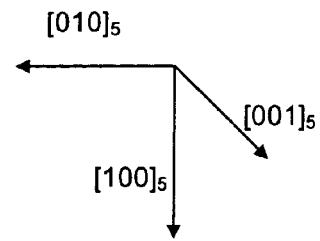
FIGS. 3a and 3b show orientations of the crystal axes of crystals from which the last lenses on the image side of the projection objective are made.
Figure 3B:
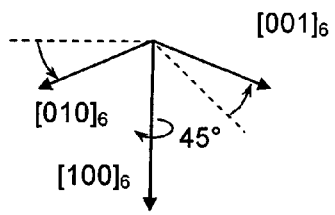

FIGS. 3a and 3b illustrate the orientations of the crystal lattices by trihedra. The calcium fluoride crystals, of which the lenses L5 and L6 are made, are aligned with respect to the optical axis 40 so that their [100] crystal axes, which are denoted respectively by $[100]_5$ and $[100]_6$, both extend parallel to the optical axis 40 of the projection objective 20. The optical axis 40 is simultaneously the symmetry axis of the lenses L5 and L6. The crystal lattices are furthermore mutually rotated by approximately 45° about the [100] crystal axis, as indicated by arrows in FIG. 3b. The combination of the lenses L5 and L6 therefore has an axisymmetric birefringence distribution overall, which may either be tolerated or compensated for with the aid of comparatively simple measures.

Figure 5:
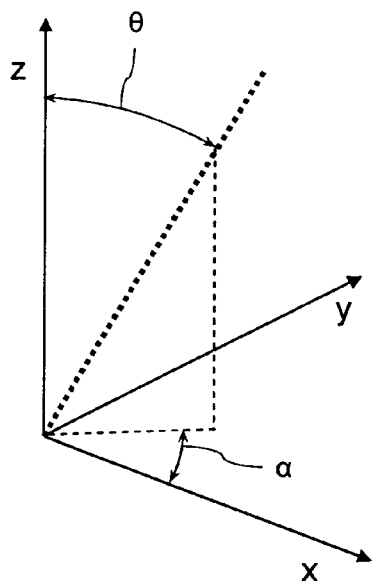
FIG. 5 shows a diagram to explain the terms aperture angle and azimuth angle.
Figure 4:
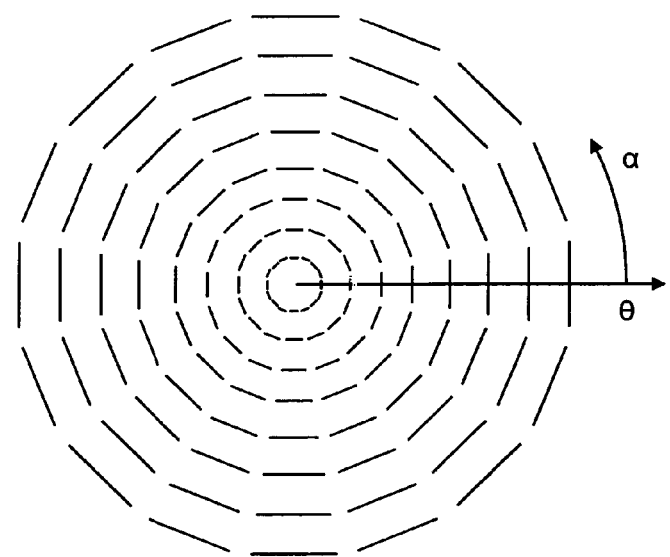
FIG. 4 shows a birefringence distribution which is generated together by the two last lenses on the image side.

As described in more detail in US 2004/0105170 A1 (already mentioned in the introduction), the content of which is fully incorporated into the subject-matter of the present application, such an arrangement of the crystal lattices leads to an axisymmetric birefringence distribution, as shown in FIG. 4. Each line in FIG. 4 represents the magnitude and the direction of a ray direction defined by the aperture angle θ and the azimuth angle α, with which a light ray strikes the lens L5. As shown in FIG. 5, the aperture angle θ denotes the angle between the z axis, which coincides with the optical axis 40, and the ray direction. The azimuth angle α indicates the angle which is formed between a projection of the light ray onto the x-y plane and the x axis, as a reference direction.

The length of the lines shown in FIG. 4 is proportional to the magnitude Δn(θ, α) of the birefringence, which is intended to mean the maximum possible refractive index difference. In geometrical terms, the length of the lines describes the difference in the major axis lengths of an elliptical section through the refractive index ellipsoid, while the direction of the lines indicates the orientation of the longer major axis of the elliptical section. The elliptical section is obtained by cutting the refractive index ellipsoid, for the relevant ray of direction (θ, α), with a plane which is perpendicular to the ray direction and contains the centre of the refractive index ellipsoid.

As shown by FIG. 4, the resulting birefringence distribution Δn(θ, α) is axisymmetric with the alignment of the crystal lattices as shown in FIGS. 3a, 3b. The slow birefringent axes i.e. the longer major axes of the elliptical sections, along which the refractive index of the crystal is greatest for the light ray, extend tangentially.

However, the superposition of the individual birefringence distributions of the lenses L5 and L6 to form a common birefringence distribution, as shown in FIG. 4, is applicable only to the case in which the light rays pass through the two lenses L5 and L6 at the same angle, and therefore travel the same physical path lengths. This condition is fulfilled by plane-parallel plates of equal thickness. For the lenses L5 and L6, however, this is still approximately the case since the gap 46 acts as a very thin meniscus, and therefore only slightly refracts the transmitted light rays. Furthermore, the radii of curvature $r_1$, $r_2$ are selected so that a light ray passing through the lens L5 travels a physical path length at least with the same order of magnitude as in the lens L6.

In principle, it is possible to make the two lenses L5, L6 from different calcium fluoride crystals, and then to fit them into a housing of the projection objective 20 so that the crystal axes of the crystal lattices are mutually oriented in the desired way. It is furthermore possible to make the two lenses L5 and L6 from different intrinsically birefringent materials, for example calcium fluoride on the one hand and barium fluoride on the other hand. This is described in detail in US 2003/0137733 A1 in the name of the Applicant, the content of which is likewise fully incorporated into the subject-matter of the present application.

A method for producing the lenses L5 and L6, which is distinguished by particularly efficient utilization of material, will be described below with reference to FIGS. 6a to 6c.

Figure 6A:
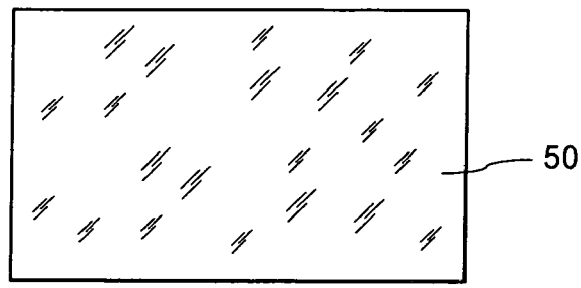
FIG. 6a shows a section through a lens preform made of a calcium fluoride crystal.
Figure 6B:
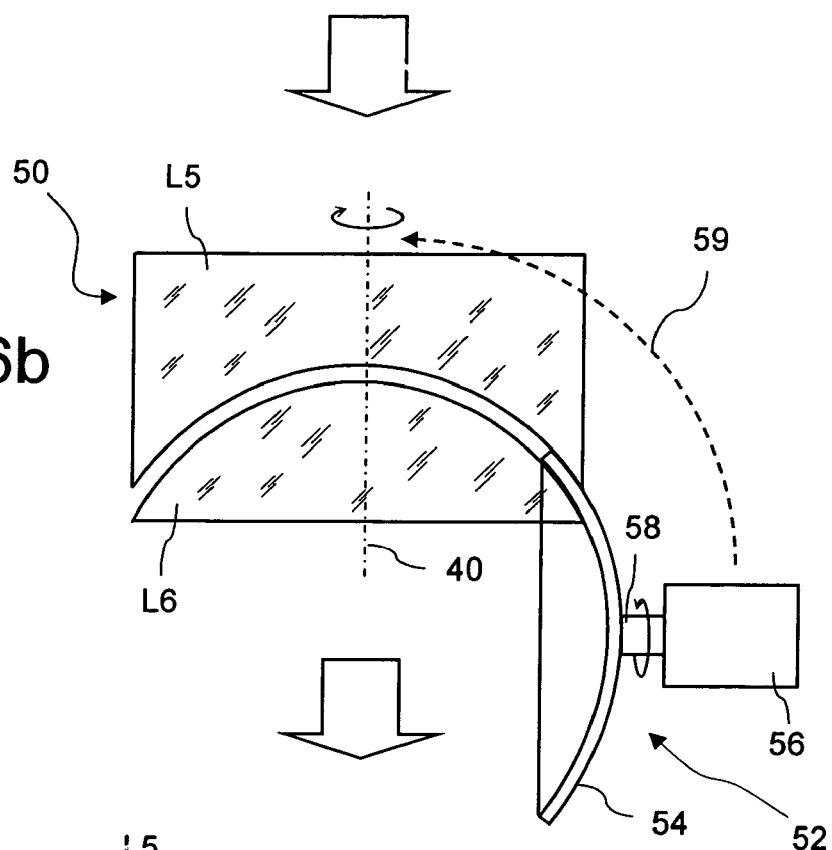
FIG. 6b shows the calcium fluoride crystal of FIG. 6a, which has been divided into two lenses with the aid of a separating device.
Figure 6C:
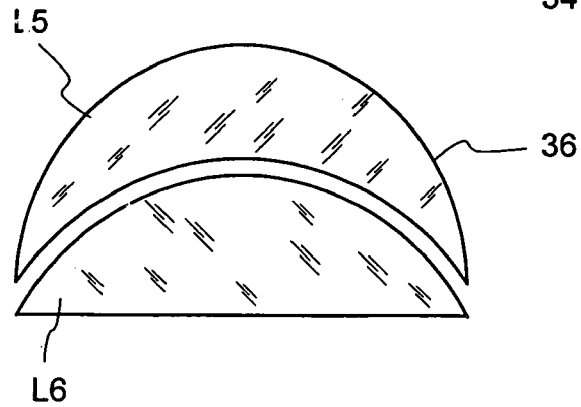
FIG. 6c shows the two lenses created by splitting, after the production of a further curved surface.

FIG. 6a shows an axial section through a disc-shaped lens preform 50, which consists of a homogeneous calcium fluoride single crystal. The lens preform 50 is then divided into the two lenses L5 and L6 along a curved separating surface with the aid of a suitable separating method as shown in an axial section in FIG. 6b. A separating device denoted here overall by 52, as described in detail in US 2004/0065117 A1, is used in order to divide the lens preform 50 along a curved bowl-shaped separating surface. The content of this document is hereby fully incorporated into the subject-matter of the present application.

The separating device 52 comprises a separating tool 54, which has the shape of a spherical cap. The separating tool 54 can be rotated about a rotation axis 58 with the aid of a drive 56. By tilting the separating device 52 in the direction indicated by the dashed arrow 59, a spherical cut can be made in the lens preform 50. If the lens preform 50 is simultaneously rotated about the subsequent symmetry axis of the lenses L5, L6, which coincides with the optical axis 40, then the lens preform 50 is finally divided into the two lenses L5 and L6.

The front surface 36 of the lens L5 can then be convexly milled, if this was not already done before the separation. The optical surfaces of the lenses L5 and L6 pre-processed in this way are finally polished, analyzed and optionally finished in a manner which is known per se.

Since the two lenses L5, L6 are produced by splitting from a single lens preform 50 in this method, a significant amount of material is saved compared with production from two individual lens preforms. The saving approximately amounts to a lens preform with the thickness of the lens L6. Since calcium fluoride and similar suitable cubic crystalline materials are very expensive and available only in small quantities, a significant cost saving can be achieved in this way.

Further exemplary embodiments and variants of the invention will be described below.

Instead of calcium fluoride ($CaF_2$) crystals, for example, it is possible to use other cubic crystalline materials which are known per se in the prior art, for example $BaF_2$, $LiF_2$, $SrF_2$ or mixed crystals such as $Ca_{1-x}Ba_xF_2$.

Besides this, it is also possible to mutually orient the crystal axes of the lenses L5, L6 in a different way from that explained above with reference to FIGS. 2 to 5. Two calcium fluoride crystals, whose [111] crystal axes (or principal axes equivalent to these) are oriented along the optical axis 40, may for example be mutually rotated through an angle of 60° as described in US 2004/0105170 A1. Any orientation of the crystal axes which makes the birefringence distribution approximate an axisymmetric distribution may be envisaged in this case.

Figure 7:
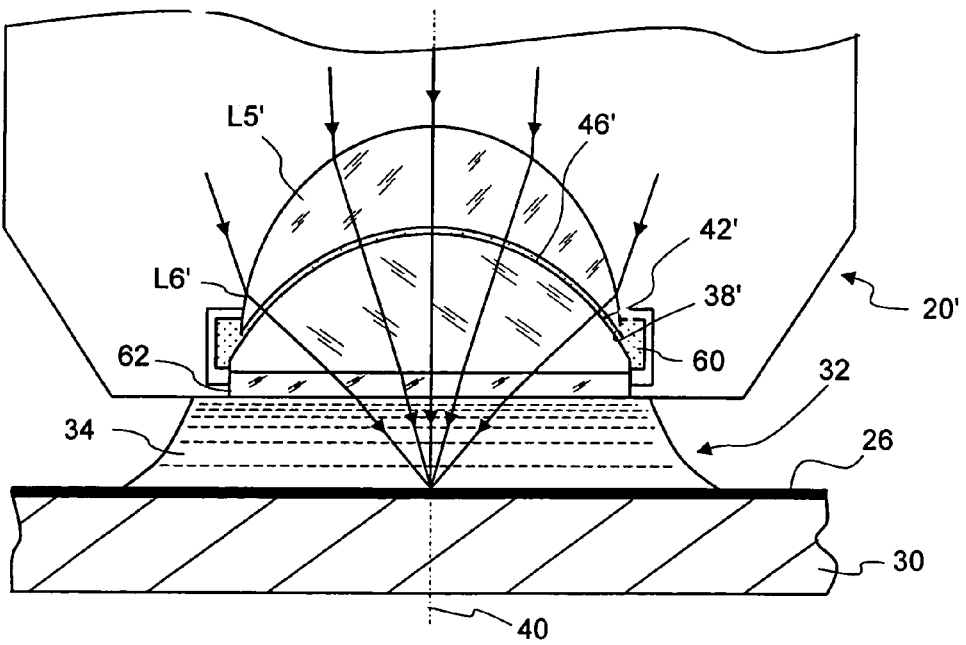
FIG. 7 shows an enlarged part of an image-side end of a projection objective according to a second exemplary embodiment of the invention.

In a representation analogous to FIG. 2, FIG. 7 shows the image-side end of a projection objective 20' in which the gap 46' between the lenses L5' and L6' is filled with a liquid 60 whose refractive index is close to the refractive indices of the lenses L5', L6'. The liquid 60 may, for example, be the same liquid as that used for the immersion liquid 34. The liquid 60 reduces the refractive index ratio at the rear surface 38' of the lens L5' and the front surface 42' of the lens L6', so that transmitted light rays are at most slightly refracted at the gap 46'. The liquid 60 also reduces the requirements which are placed on the fit of the surfaces 38', 46'.

In the projection objective 20 shown in FIG. 7 there is furthermore a somewhat thicker closure plate 62, which consists of the same crystal material as the lens L5', between the lens L6' and the immersion liquid 34, and the orientations of the crystal axes also match. The lens L6' is somewhat thicker for this reason, so that approximately the same physical path lengths are achieved in the differently oriented crystals.

Figure 8:
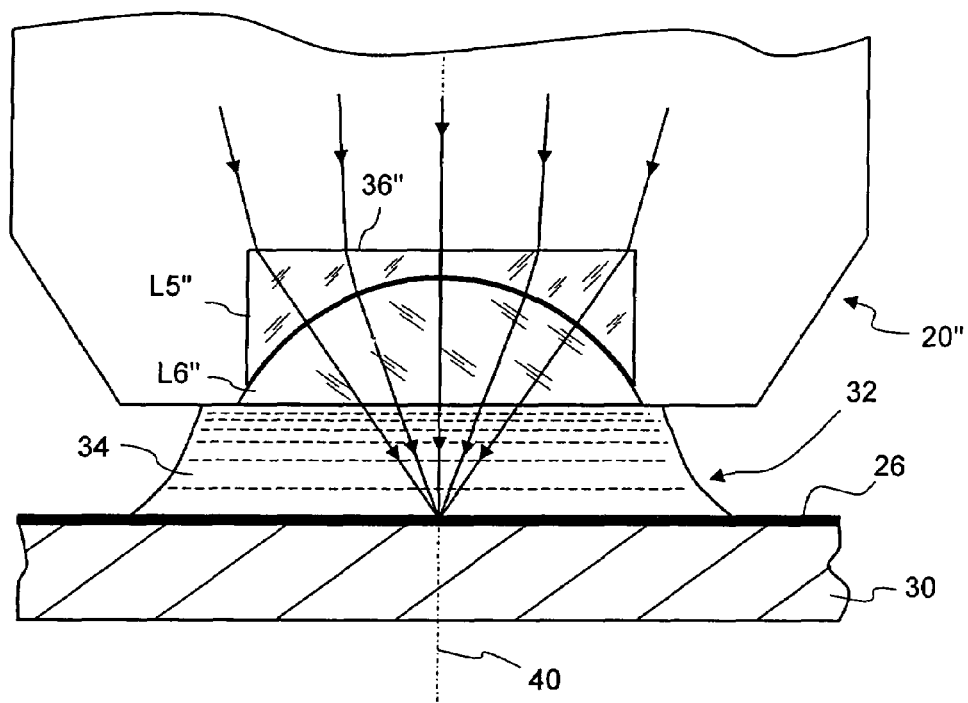
FIG. 8 shows an enlarged part of an image-side end of a projection objective according to a third exemplary embodiment of the invention.

In a representation which is likewise analogous to FIG. 2, FIG. 8 shows the image-side end of a projection objective 20" according to a further exemplary embodiment of the invention. The projection objective 20" differs from the projection objective 20 shown in FIGS. 1 and 2 in so far as the front surface 36" of the lens L5" is planar. The lens L6" is furthermore contact bonded directly onto the lens L5", so that no gap remains between the two lenses L5", L6".

The arrangement of the two lenses L5", L6" therefore acts as a plane-parallel plate which is corrected with respect to the intrinsic birefringence. Since the separating surface which divides this plate into the two lenses L5", L6" is concavely curved, even those light rays which make large angles with the optical axis 40 pass through this interface at small angles of incidence.

Total reflection cannot therefore take place at the interface between the crystals with different orientations of the crystal axes.

Naturally, the same applies even if a very narrow or liquid-filled gap remains between the lenses L5", L6".

It should be understood that the two front surfaces 36 and 42 and the rear surface 38 need not necessarily be spherical in the exemplary embodiments described above. For the function of the invention, it is also not essential that the surfaces 38 and 42 should have the same centre of curvature M. Instead, the surfaces 38, 42 may be differently shaped spherically or aspherically. If the production method illustrated with reference to FIGS. 6a and 6c is used, however, then the formation of differently shaped surfaces 38, 42 is possible only if they are reprocessed in the desired way with other tools known per se, for example milling tools, after separation.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A projection objective of a microlithographic projection exposure apparatus for imaging a reticle that can be arranged in an object plane of the projection objective onto an image plane, comprising:
   a) a first lens which is the penultimate curved optical element on the image side, has a concave surface on the image side and contains a first intrinsically birefringent crystal which has a first orientation of the crystal axes, and
   b) a second lens which is the last curved optical element on the image side, has a convex surface on the object side and contains a second intrinsically birefringent crystal, which has a second orientation of the crystal axes that can be described by rotating the first orientation of the crystal axes about a symmetry axis of the first lens,
   wherein the first and second orientations of the crystal axes are selected so that an intrinsic birefringence due to the first crystal, together with an intrinsic birefringence due to the second crystal, leads in total to at least approximately axisymmetric distribution of the overall birefringence, and
   wherein the concave surface of the first lens is spherical, the convex surface of the second lens is spherical, and the concave surface of the first lens and the convex surface of the second lens have at least approximately the same centre of curvature.

2. The projection objective of claim 1, wherein the first lens touches the second lens.

3. The projection objective of claim 2, wherein the first lens is contact bonded to the second lens.

4. The projection objective of claim 1, wherein the first lens is separated from the second lens by a gap.

5. The projection objective of claim 4, wherein the gap has a uniform thickness.

6. The projection objective of claim 4, wherein the gap is filled with a liquid.

7. The projection objective of claim 6, wherein the refractive index of the liquid differs by no more than 5% from the refractive indices of the adjacent crystals.

8. The projection objective of claim 1, wherein the concave surface of the first lens has a curvature which is selected so that no light ray passing through this surface is totally reflected.

9. The projection objective of claim 8, wherein the curvature is selected as a function of a numerical aperture of the projection objective, a refractive index of the first crystal and a refractive index of a medium surrounding the first cyrstal.

10. The projection objective of claim 1, wherein the first lens is convex on the object side.

11. The projection objective of claim 1, which is designed for immersed operation.

12. The projection objective of claim 11, comprising an immersion liquid between the second lens and the image plane.

13. The projection objective of claim 1, wherein the crystals have an index of refraction of more than 1.7 for the projection light used in the projection exposure apparatus.

14. The projection objective of claim 13, wherein the crystals are selected from the group comprising:
   $MgAl_2O_4$
   $X_3Al_5O_{12}$ with X=Lu, Sc or a mixture thereof;
   $X_3Y_2Z_3O_{12}$ with X=Mg, Ca; Y=Al, Ga, Sc, Y, Lu; Z=Ge, Si.

15. The projection objective of claim 1, wherein at least one plane-parallel transparent plate is arranged between the second lens and the image plane.

16. A microlithographic projection exposure apparatus, comprising:
   a) an illumination system;
   b) a projection objective of a microlithographic projection exposure apparatus for imaging a reticle that can be arranged in an object plane of the projection objective onto an image plane, said projection objective comprising:
      a first lens which is the penultimate curved optical element on the image side, has a concave surface on the image side and contains a first intrinsically birefringent crystal which has a first orientation of the crystal axes, and
      a second lens which is the last curved optical element on the image side, has a convex surface on the object side and contains a second intrinsically birefringent crystal, which has a second orientation of the crystal axes that can be described by rotating the first orientation of the crystal axes about a symmetry axis of the first lens, wherein the first and second orientations of the crystal axes are selected so that an intrinsic birefringence due to the first crystal, together with an intrinsic birefringence due to the second crystal, leads in total to at least approximately axisymmetric distribution of the overall birefringence, and wherein the first lens is contact bonded to the second lens.

17. A projection objective of a microlithographic projection exposure apparatus for imaging a reticle that can be arranged in an object plane of the projection objective onto an image plane, comprising:
   a) a first lens which is the penultimate curved optical element on the image side, has a convex surface on the object side, a concave surface on the image side and contains a first intrinsically birefringent crystal which has a first orientation of the crystal axes, and
   b) a second lens which is the last curved optical element on the image side, has a convex surface on the object side and contains a second intrinsically birefringent crystal, which has a second orientation of the crystal axes that can be described by rotating the first orientation of the crystal axes about a symmetry axis of the first lens, wherein the second lens has a planar surface on the image side.

18. The projection objective of claim 17, wherein the first lens has a radius of curvature on the object side that is smaller than 1000 mm.

19. The projection objective of claim 18, wherein the first lens has a radius of curvature on the object side that is smaller than 500 mm.

20. A method for the production of a projection objective of a microlithographic projection exposure apparatus, which is intended for imaging a reticle that can be arranged in an object plane of the projection objective onto an image plane, said method comprising the following steps:
   a) providing a housing of the projection objective,
   b) providing a crystal which is optically birefringent for the wavelength used in the projection exposure apparatus;
   c) splitting the crystal into a first lens and a second lens along a curved bowl-shaped separating surface, which is axisymmetric with respect to a symmetry axis, so that the first lens is provided with a concave surface;
   d) mutually rotating the two lenses about the symmetry axis;
   e) fitting the first and second rotated lenses into the housing so that the first lens is the penultimate curved lens on the image side and the second lens is the last curved lens on the image side of the projection objective.

21. The method of claim 20, wherein the two lenses are rotated relative to each other in step d) through an angle which is dimensioned so that an intrinsic birefringence due to the first lens, together with a birefringence due to the second lens, leads in total to at least approximately axisymmetric distribution of the overall birefringence.

22. The method of claim 20, wherein the surface opposite the concave surface of the first lens is convexly shaped on the object side before step c) or step e).

23. The method of claim 20, wherein the first lens is contact bonded onto the second lens along the separating surface between step d) and step e).

24. The method of claim 20, wherein the two lenses are fitted into the housing at a distance from each other in step e), so that a gap remains between the two lenses.

25. The method of claim 20, wherein a radius of curvature is selected for the separating surface such that no light ray passing through the concave surface of the first lens is totally reflected.

26. The method of claim 25, wherein the radius of curvature is selected as a function of a numerical aperture of the projection objective, a refractive index of the first crystal and a refractive index of a medium surrounding the first crystal.

27. A method for the microlithographic production of a microstructured component, comprising the following steps:
   a) providing the projection objective of claim 1 or claim 17;
   b) arranging a reticle, which contains structures to be imaged, in an object plane of the projection objective;
   c) projecting the structures onto a photosensitive layer.

* * * * *

UNITED STATES PATENT AND TRADEMARK OFFICE
CERTIFICATE OF CORRECTION

PATENT NO.        : 7,679,721 B2                                                Page 1 of 1
APPLICATION NO.   : 11/401789
DATED             : March 16, 2010
INVENTOR(S)       : Wilfried Clauss It is certified that error appears in the above-identified patent and that said Letters Patent is hereby corrected as shown below:

Title Page, Item (54), Column 1, Line 1, delete "PROJECTION OBJECTIVE OF A MICROLITHOGRAPHIC PROJECTION EXPOSURE APPARATUS AND METHOD FOR ITS PRODUCTION"
insert
-- PROJECTION OBJECTIVE OF A MICROLITHOGRAPHIC EXPOSURE APPARATUS AND METHOD FOR ITS PRODUCTION --.

Title Page, Item (57), Column 2, Line 2, delete "penul-timate" insert -- penultimate --.

Column 1, Line 1, delete "PROJECTION OBJECTIVE OF A MICROLITHOGRAPHIC PROJECTION EXPOSURE APPARATUS AND METHOD FOR ITS PRODUCTION"
insert
-- PROJECTION OBJECTIVE OF A MICROLITHOGRAPHIC EXPOSURE APPARATUS AND METHOD FOR ITS PRODUCTION --.

Column 2, Line 15, delete "bire-fringence" insert -- birefringence --.

Column 4, Line 6, delete "LUAG" insert -- LuAG, --.

Column 10, Line 29, Claim 9, delete "cyrstal." insert -- crystal. --.

Signed and Sealed this

First Day of June, 2010

David J. Kappos
*Director of the United States Patent and Trademark Office*